(12) United States Patent
Gouhl et al.

(10) Patent No.: US 10,102,733 B2
(45) Date of Patent: Oct. 16, 2018

(54) CIRCUIT INTERRUPTER WITH AUDIBLE INDICATOR CIRCUIT

(71) Applicant: EATON CORPORATION, Cleveland, OH (US)

(72) Inventors: Erik Jefferey Gouhl, Fayetteville, GA (US); Luis F. Salas, Fayetteville, GA (US); Pramod Kumar, Peachtree City, GA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 267 days.

(21) Appl. No.: 15/047,097

(22) Filed: Feb. 18, 2016

(65) Prior Publication Data

US 2017/0243462 A1    Aug. 24, 2017

(51) Int. Cl.
| | |
|---|---|
| *H02H 3/00* | (2006.01) |
| *G08B 21/18* | (2006.01) |
| *H02H 3/16* | (2006.01) |
| *G01R 31/02* | (2006.01) |
| *H02H 3/04* | (2006.01) |
| *H02H 1/00* | (2006.01) |

(52) U.S. Cl.
CPC ............. *G08B 21/185* (2013.01); *H02H 3/16* (2013.01); *G01R 31/024* (2013.01); *H02H 1/0015* (2013.01); *H02H 3/04* (2013.01)

(58) Field of Classification Search
USPC ...................................................... 361/42–50
See application file for complete search history.

(56) References Cited

U.S. PATENT DOCUMENTS

| | | | | |
|---|---|---|---|---|
| 6,052,266 A | * | 4/2000 | Aromin | H01H 47/04 361/42 |
| 2007/0195470 A1 | * | 8/2007 | Zhang | H02H 3/335 361/42 |
| 2011/0222195 A1 | * | 9/2011 | Benoit | H01H 1/5866 361/45 |
| 2016/0178691 A1 | * | 6/2016 | Simonin | G01R 31/2827 361/42 |

* cited by examiner

*Primary Examiner* — Danny Nguyen
(74) *Attorney, Agent, or Firm* — Eckert Seamans

(57) ABSTRACT

A circuit interrupter includes a line conductor, a neutral conductor, separable contacts structured to open to interrupt current flowing through the line and neutral conductors, a circuit interrupter circuit structured to detect a fault based on current flowing through the line and neutral conductors and to output a trip signal in response to detecting the fault, a trip circuit structured to trip open the separable contacts in response to the trip signal, and an audible indicator circuit structured to output an audible sound in response to the trip circuit tripping open the separable contacts.

8 Claims, 4 Drawing Sheets

CIRCUIT INTERRUPTER WITH AUDIBLE INDICATOR CIRCUIT

BACKGROUND

Field

The disclosed concept relates generally to circuit interrupters, and in particular, to circuit interrupters with a trip indicator.

Background Information

Circuit interrupters are typically used to protect electrical circuitry from damage due to a fault condition such as an arc fault or a ground fault. Circuit interrupters typically include separable contacts. The separable contacts are operated automatically in response to a detected fault condition. One type of a circuit interrupter is a ground fault circuit interrupter (GFCI).

An existing ground fault circuit interrupter (GFCI) 100 is shown in FIG. 1. The GFCI 100 is structured to detect a ground fault on a protected circuit and trip open separable contacts 102 in response to the detected ground fault. The GFCI includes a light emitting diode (LED) 104 that lights up when the separable contacts 102 are tripped open. However, a user may not normally be looking at the GFCI 100, and thus may not notice that the LED 104 is lit.

There is therefore room for improvement in circuit interrupters.

SUMMARY

These needs and others are met by embodiments of the disclosed concept in which a circuit interrupter includes an audible indicator circuit structured to output an audible sound in response to a trip circuit tripping open separable contacts.

In accordance with aspects of the disclosed concept, a circuit interrupter comprises: a line conductor; a neutral conductor; separable contacts structured to open to interrupt current flowing through the line and neutral conductors; a circuit interrupter circuit structured to detect a fault based on current flowing through the line and neutral conductors and to output a trip signal in response to detecting the fault; a trip circuit structured to trip open the separable contacts in response to the trip signal; and an audible indicator circuit structured to output an audible sound in response to the trip circuit tripping open the separable contacts.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
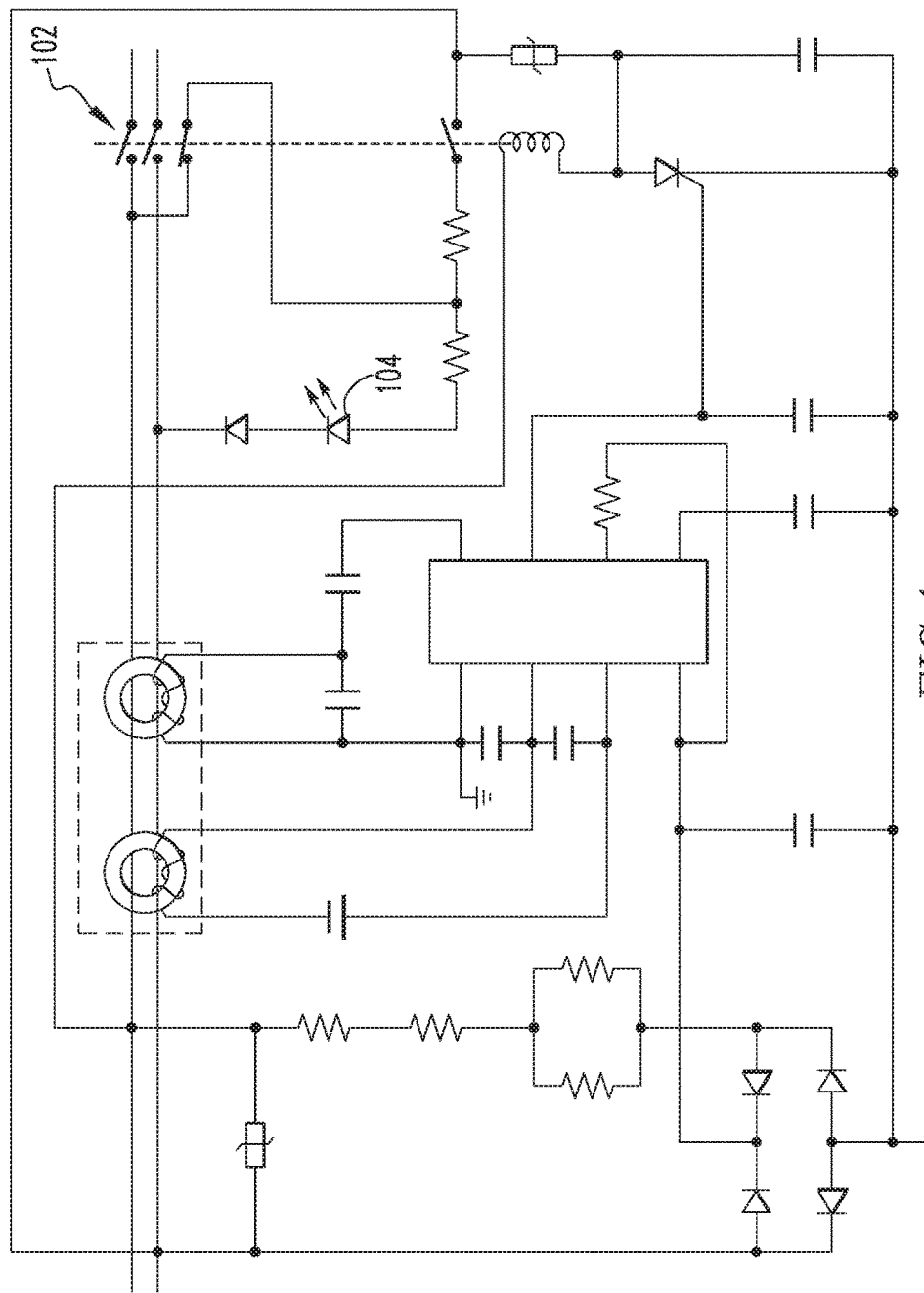
FIG. 1 is a circuit diagram of a GFCI.

Directional phrases used herein, such as, for example, left, right, front, back, top, bottom and derivatives thereof, relate to the orientation of the elements shown in the drawings and are not limiting upon the claims unless expressly recited therein.

As employed herein, the statement that two or more parts are "coupled" together shall mean that the parts are joined together either directly or joined through one or more intermediate parts.

Figure 2:
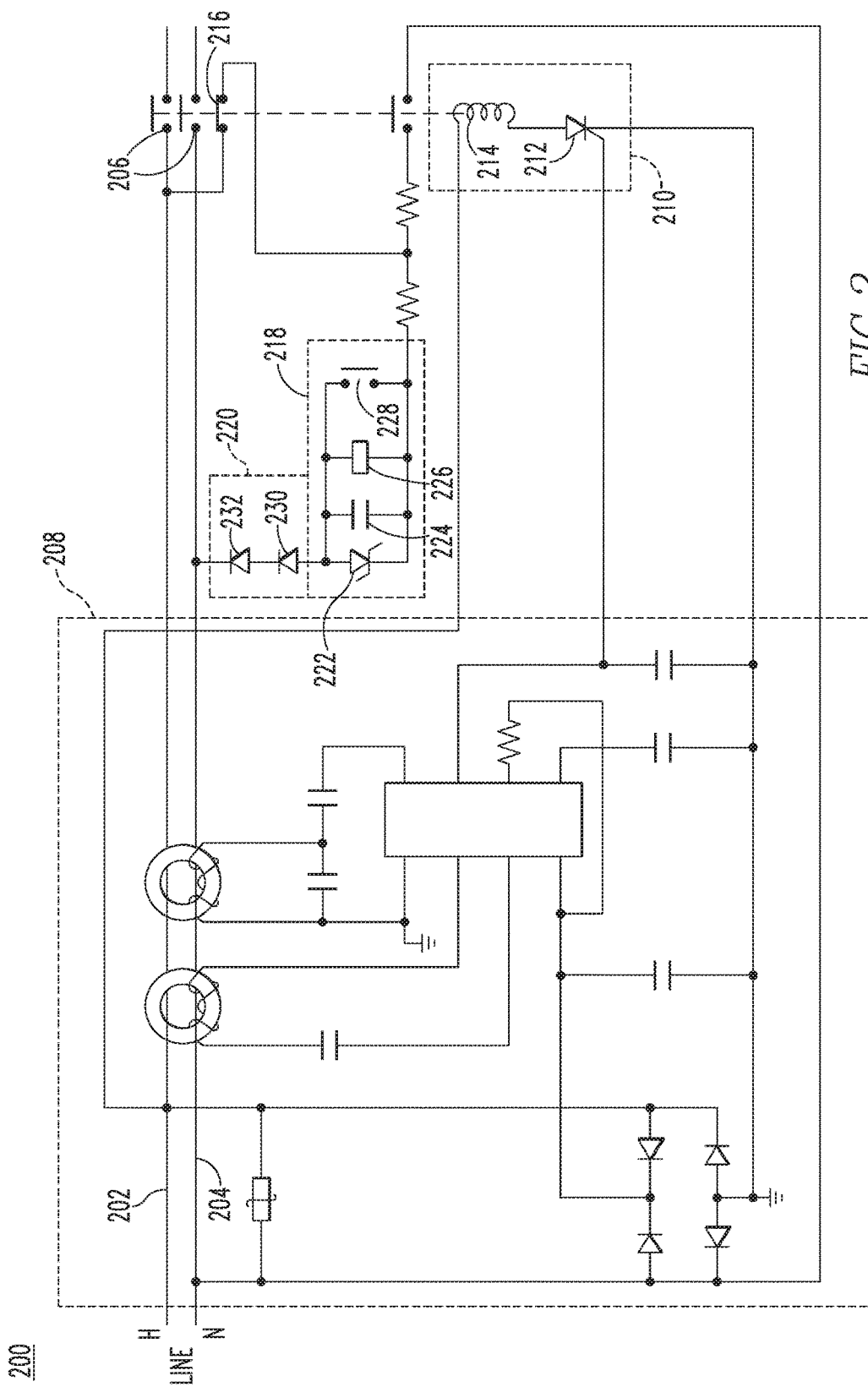
FIG. 2 is a circuit diagram of a GFCI including an audible indicator circuit in accordance with an example embodiment of the disclosed concept.

FIG. 2 is a circuit diagram of a ground fault circuit interrupter (GFCI) 200 in accordance with an example embodiment of the disclosed concept. The GFCI 200 includes line and neutral conductors 202,204 that pass through it. The GFCI also includes separable contacts 206. Opening the separable contacts 206 interrupts current flowing through the line and neutral conductors 202,204.

The GFCI 200 further includes a GFCI circuit 208. The GFCI circuit 208 is structured to detect a ground fault based on the current flowing through the line and neutral conductors 202,204. One example embodiment of a GFCI circuit 208 is shown in FIG. 2. However, it will be appreciated by those having ordinary skill in the art that any circuit suitable to detect a ground fault may be employed without departing from the scope of the disclosed concept. In response to detecting the ground fault, the GFCI circuit 208 is structured to output a trip signal.

The GFCI 200 additionally includes a trip circuit 210. The trip circuit 210 is structured to receive the trip signal from the GFCI circuit 200 and, in response, to trip open the separable contacts 206. In the example embodiment of the disclosed concept shown in FIG. 2, the trip circuit 210 includes a silicon controlled rectifier (SCR) 212 and a solenoid 214. The SCR 212 and is electrically connected in series with a coil of the solenoid 214. The SCR 212 is structured to receive the trip signal at its gate. In response to receiving the trip signal, the SCR 212 closes and allows current to flow through the coil of the solenoid 214. The solenoid 214 is operatively connected to the separable contacts 206 such that the solenoid 214 causes the separable contacts 206 to trip open when current flows through its coil. Although one example of a trip circuit 210 is shown in FIG. 2, it will be appreciated by those having ordinary skill in the art that other suitable types of trip circuits may be employed without departing from the scope of the disclosed concept.

The GFCI 200 further includes an auxiliary switch 216, an audible indicator circuit 218 and a visual indicator circuit 220. The auxiliary switch 216 is electrically connected between the line conductor 202 and the audible indicator circuit 218. The trip circuit 210 is operatively connected to the auxiliary switch 216 such that when the trip circuit 210 causes the separable contacts 206 to trip open, it also causes the auxiliary switch 216 to close. When the auxiliary switch 216 closes, current is able to flow from the line conductor 202 to the audible indicator circuit 218.

The audible indicator circuit 218 is structured to output an audible sound in response to the trip circuit 210 tripping open the separable contacts 206. The audible indicator circuit 218 includes a zener diode 222, a capacitor 224, a buzzer 226 and a switch 228. The zener diode 222, the capacitor 224, the buzzer 226 and the switch 228 are all electrically connected in parallel with each other. The zener diode 222 limits the voltage across the buzzer 226 and the capacitor 224 enhances filtering of the voltage across the buzzer 226. The buzzer 226 is a sound producing device that is structured to output an audible sound when current flows through it. When the trip circuit 210 trips open the separable contacts 206 and closes the auxiliary switch 216, current is able to flow from the line conductor 202 to the buzzer 226, thus causing the buzzer to output the audible sound.

The audible indicator circuit 218 further includes the switch 228. When the switch 228 is closed, current bypasses the buzzer 226, thus causing the buzzer 226 to stop outputting the audible sound. The switch 228 is normally open and is structured to be operated by a user. A user may actuate the switch 228 to close it and silence the buzzer 226.

In addition to the audible indicator circuit 218, the GFCI 200 includes the visual indicator circuit 220. The visual indicator circuit 220 is electrically connected in series with the audible indicator circuit 218 and is structured to output a visual indication in response to the trip circuit 210 tripping open the separable contacts 206. The visual indicator circuit 220 includes a light emitting diode (LED) 230 and a diode 232. When the trip circuit 210 trips open the separable contacts 206 and closes the auxiliary switch 216, current is able to flow from the line conductor 202 to the visual indicator circuit 220, thus causing the LED 230 to light up.

Figure 3:
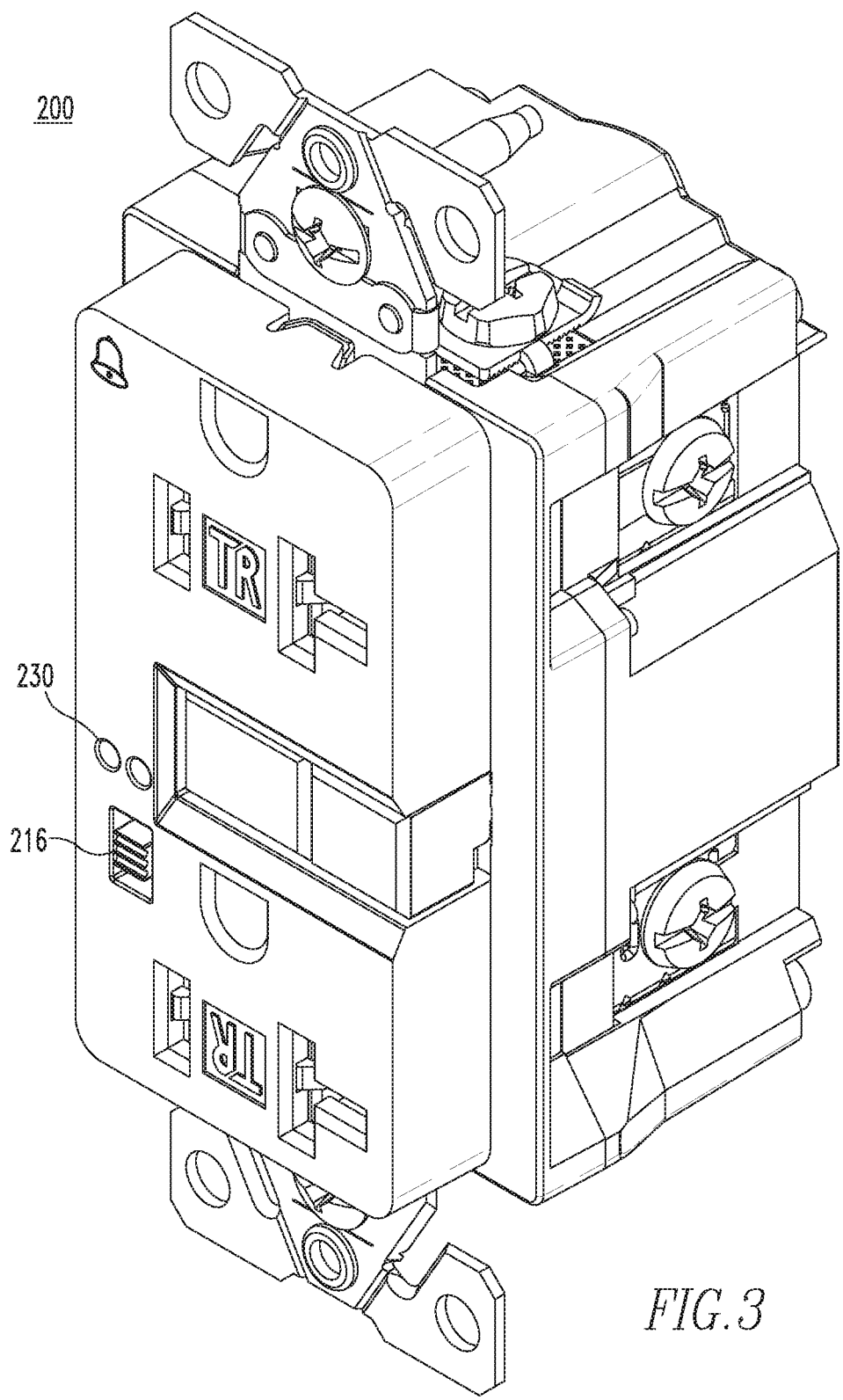
FIG. 3 is a perspective view of the exterior of the GFCI of FIG. 2 in accordance with an example embodiment of the disclosed concept.

FIG. 3 is a perspective view of the GFCI 200 of FIG. 2 in accordance with an example embodiment of the disclosed concept. As shown in FIG. 3, the switch 216 is accessible to a user of the GFCI 200. As previously described, the user may operate the switch 216 to silence the audible sound output by the audible indicator circuit 218. Additionally, the LED 230 is visible from the exterior of the GFCI 200 so that a user of the GFCI 200 can observe when the LED 230 is lit.

Users of the GFCI 200 may not normally be looking at the GFCI 200, so they may not easily notice if a visual indication that it has tripped is present. However, the audible sound output by the audible indicator circuit 218 in response to the trip circuit 210 tripping open the separable contacts 206 is noticeable even if the user is not looking at the GFCI 200. After noticing that the GFCI 200 has tripped, the user can actuate the switch 228 to silence the audible indication. The visual indication provided by the GFCI 200 will remain after the audible indication is silenced.

Although the GFCI 200 is disclosed, it will be appreciated by those having ordinary skill in the art that the disclosed concept may also be employed in other types of circuit interrupters such as, without limitation, arc fault circuit interrupters (AFCI) and combination AFCI/GFCI devices.

Figure 4:
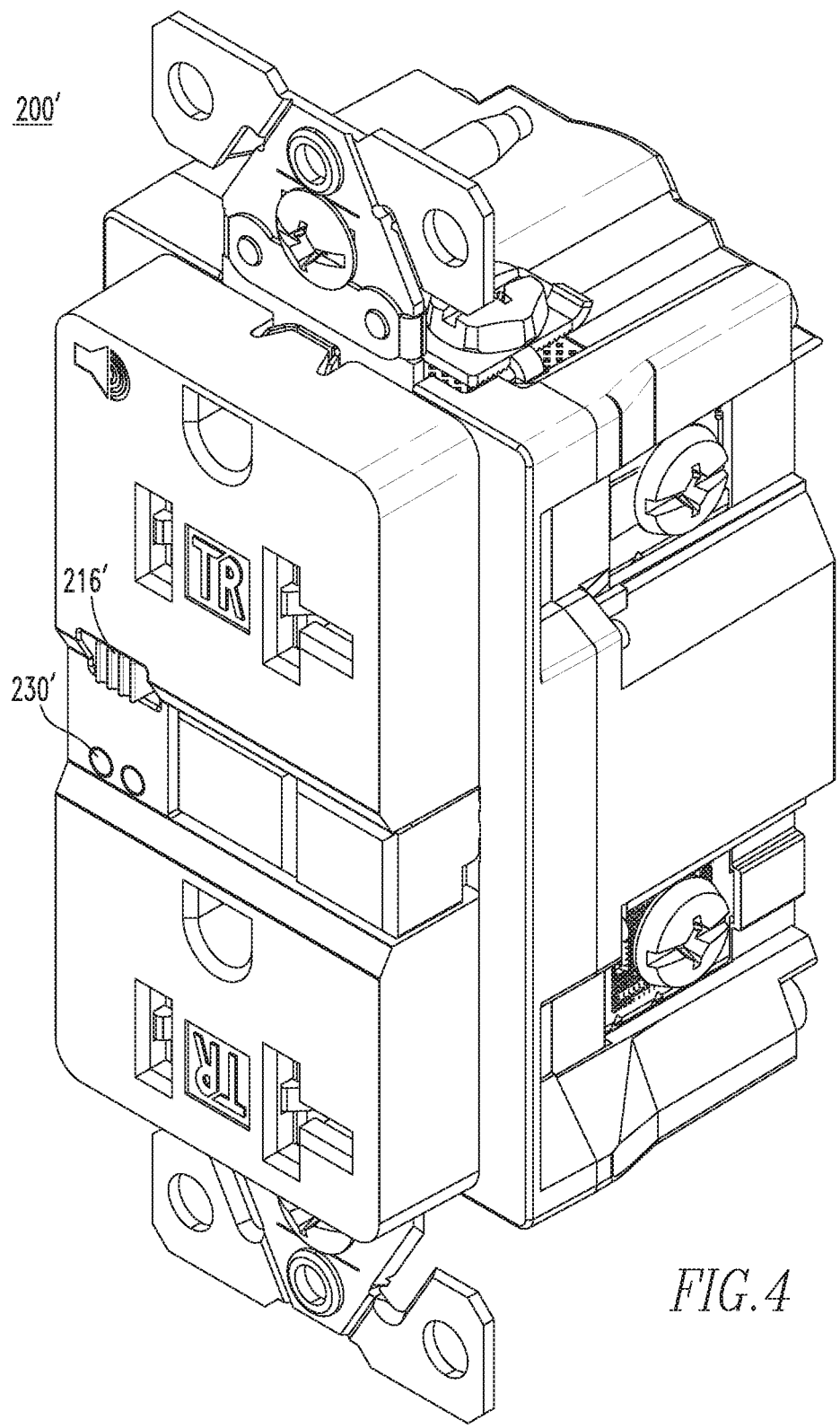
FIG. 4 is a perspective view of an exterior of a GFCI in accordance with another example embodiment of the disclosed concept.

FIG. 4 is a perspective view of a GFCI 200' in accordance with another example embodiment of the disclosed concept. The GFCI 200' includes similar components as the GFCI 200 of FIGS. 2 and 3 and provides the same functionality as the GFCI 200 of FIGS. 2 and 3. However, the exterior configuration of the GFCI 200' of FIG. 4 includes a switch 216' and LED 230' that have been slightly modified and repositioned compare to the switch 216 and LED 230 of the GFCI 200 of FIGS. 2 and 3. It will be appreciated by those having ordinary skill in the art that various modifications may be made to the exterior or interior of the GFCIs 200,200' of FIGS. 2-4 without departing from the scope of the disclosed concept.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A circuit interrupter comprising:
a line conductor;
a neutral conductor;
separable contacts structured to open to interrupt current flowing through the line and neutral conductors;
a circuit interrupter circuit structured to detect a fault based on current flowing through the line and neutral conductors and to output a trip signal in response to detecting the fault;
a trip circuit structured to trip open the separable contacts in response to the trip signal;
an audible indicator circuit structured to output an audible sound in response to the trip circuit tripping open the separable contacts; and
a visual indicator circuit structured to output a visual indication in response to the trip circuit tripping open the separable contacts, the visual indicator circuit being electrically connected in series with the audible indicator circuit and including a diode and a light emitting diode (LED) electrically connected in series, and
wherein the audible indicator circuit includes a buzzer structured to output the audible sound in response to current being passed through it, a zener diode, a capacitor and a switch, and
wherein the buzzer, the zener diode, the capacitor and the switch are electrically connected in parallel with each other.

2. The circuit interrupter of claim 1, further comprising:
a switch electrically connected between the line conductor and the audible indicator circuit,
wherein the trip circuit is structured to close the switch when the tripping open the separable contacts.

3. The circuit interrupter of claim 1, wherein the visual indication is visible from an exterior of the circuit interrupter.

4. The circuit interrupter of claim 1, wherein closing the switch causes the buzzer to stop outputting the audible sound.

5. The circuit interrupter of claim 4, wherein the switch is structured to be operated by a user of the circuit interrupter.

6. The circuit interrupter of claim 1, wherein the circuit interrupter circuit is structured to detect a ground fault.

7. The circuit interrupter of claim 1, wherein the circuit interrupter circuit is structured to detect an arc fault.

8. The circuit interrupter of claim 1, wherein the trip circuit includes a silicon controlled rectifier (SCR) and a trip coil.

* * * * *